United States Patent [19]

Lin

[11] Patent Number: 5,578,506
[45] Date of Patent: Nov. 26, 1996

[54] METHOD OF FABRICATING IMPROVED LATERAL SILICON-ON-INSULATOR (SOI) POWER DEVICE

[75] Inventor: John Lin, Ellicott City, Md.

[73] Assignee: AlliedSignal Inc., Morris Township, N.J.

[21] Appl. No.: 395,237

[22] Filed: Feb. 27, 1995

[51] Int. Cl.$^6$ .......................... H01L 21/265; H01R 21/22
[52] U.S. Cl. .............................. 437/21; 437/157; 437/904
[58] Field of Search ................................ 437/29, 904, 21, 437/157, 969

[56] References Cited

U.S. PATENT DOCUMENTS

| | | | |
|---|---|---|---|
| 3,513,042 | 1/1965 | Hagon | 437/904 |
| 3,677,838 | 7/1972 | Brebisson | 437/904 |
| 3,919,010 | 11/1975 | Borchert et al. | 437/904 |
| 4,024,563 | 5/1977 | Tasch, Jr. | 437/241 |
| 4,764,249 | 8/1988 | Gobrechet et al. | |
| 5,139,959 | 8/1992 | Craft et al. | 437/904 |
| 5,246,870 | 9/1993 | Merchant . | |
| 5,300,448 | 4/1994 | Merchant et al. | |

OTHER PUBLICATIONS

Merchant, S. et al, "Realization of High Breakdown Voltage In Thin SOI Devices", pp. 31–35.
Stengl, R., et al. "Variation of Lateral Doping as a Field Terminator for High-Voltage Power Devices", Mar., 1986, pp. 426–428.
Wrathall, R. S., et al. "Charge Controlled 80 Volt Lateral DMOSFET with Very Low Specific On-Resistance Designed for an Integrated Power Process", pp. 32.8.1–32.8.4.

*Primary Examiner*—George Fourson
*Assistant Examiner*—Brian K. Dutton
*Attorney, Agent, or Firm*—John R. Rafter

[57] ABSTRACT

A high performance lateral Silicon-On-Insulator (SOI) power device having a high breakdown voltage ($\leq 100$ v). The SOI power device includes a silicon layer formed on an oxide layer over a silicon substrate. A mask having a single opening on the anode (drain) side of the silicon layer is formed thereon such that an impurity may be introduced into the silicon layer. The resultant dopant is implanted in the anode side and laterally diffused by high temperature annealing. The resultant device sustains breakdown voltages of up to 100 volts and enables an extremely low on-state resistance of 1.2 milliohm-cm$^2$.

9 Claims, 3 Drawing Sheets

METHOD OF FABRICATING IMPROVED LATERAL SILICON-ON-INSULATOR (SOI) POWER DEVICE

TECHNICAL FIELD

The present invention involves the structure of a thin film, high performance, lateral Silicon-On-Insulator (SOI) power device having a high breakdown voltage ($\leq 100$ v). In particular, the present invention is directed to a structure and method for fabricating the structure in which a dopant is implanted in a silicon layer through a single mask opening so as to create a tailored, open dopant profile.

BACKGROUND ART

It has been known that the voltage-blocking capability in a lateral Silicon-On-Insulator (SOI) device structure is usually limited by a peaking of the electric fields on the anode (drain) side. While a thicker buried oxide will result in a higher blocking voltage, an increased oxide layer thickness is further known to correspondingly impede heat dissipation due to its low thermal conductivity. While acceptable for high voltage devices (in the range >500 v), this inefficiency is wholly unacceptable for lower voltage devices, which, have a breakdown voltage of less than or equal to 100 volts.

More specifically, the design of a lateral SOI structure is impacted by three parameters: the SOI layer thickness ($T_{soi}$), lateral depletion width ($L_{bv}$) at breakdown, and buried oxide thickness ($T_{box}$). As those skilled in the art will recognize, the electric field crowding near the anode (drain) can be minimized by using the field-tailoring scheme proposed by researchers at North America Phillips Corporation, New York, N.Y. S. Merchant, E. Arnold, H. Baumgart, S. Mukherjee, H. Pein, and R. Pinker, in their paper "Realization of High Breakdown Voltage (>700 v) In Thin SOI Devices", THIRD INT. SYMP. ON POWER SEMICONDUCTOR DEVICES AND ICS, 1991, pp. 31-35, disclose a linearly-graded lateral dopant profile used to realize a 700 v (0.2-0.3 microns) thin SOI structure at the expense of a two-micron thick buried oxide.

Merchant, et al, in U.S. Pat. No. 5,300,448 also assigned to North American Phillips Corporation discloses a method and thin film transistor having a linear doping profile between the gate and drain regions. The linear doping is achieved by introducing impurities into a thin silicon layer deposited over an oxide which in turn is deposited on a silicon substrate. The impurities are introduced through a mask having a plurality of openings, each of the openings laterally increasing in dimension from that of a preceding opening. The multi-opening mask design permits the formation of a plurality of doped regions of different widths so as to form a doping profile having a minimum doping concentration at one end of the lateral distance and a maximum doping concentration at the other end of the lateral distance.

U.S. Pat. No. 5,246,870 to Merchant is similarly directed to an improvement in a self-passivated high voltage semiconductor device. The semiconductor device has a thinned SOI layer having a linear lateral doping region coated with an oxide layer and a field plate which is part of the gate electrode layer. The lateral linear doping region is formed in the silicon layer by selectively thinning the drift region by local oxidation (LOCOS), leaving a thick top oxide layer over the drift region, and forming a gate region at a side of the top oxide layer. The formed gate region has a gate electrode with a portion extending laterally over a substantial portion of the top oxide layer where the lateral extent of the gate electrode overlies the thin lateral linear doping region. The desired high voltage SOI semiconductor device is achieved using this structure.

Significantly, each of the devices discussed above is designed in accordance with the theory that a lateral linear dopant concentration profile between the cathode (source) and anode (drain) in a SOI device structure will greatly enhance the breakdown voltage. These devices therefore incorporate buried oxide layers having substantial thicknesses as well as long lateral doping gradient distances.

Still further, the devices described above are operative with supply voltages $\geq 500$ volts. These devices typically require an SOI film thickness of 2000-3000 Å (0.2-0.3 microns), a buried oxide thickness of at least 2 microns and a doping gradient over a lateral distance of 40-50 microns. As known to those skilled in the art, such devices include, for example, AC motor control technology, switching regulator technology, fluorescent light ballast technology, and telecommunications technology.

In these devices, the lateral doping gradient is achieved through the use of elaborate photolithographic schemes. See, for example, the publication of R. Stengl and U. G. Sel "Variation Of Lateral Doping A New Concept To Avoid High Voltage Breakdown Of Planar Junctions", IDEM TECH. DIG., 1985, pp. 154-157.

As discussed above, for "lower voltage" devices, i.e. those having a breakdown voltage of $\leq 100$ volts, thick oxide layers are unacceptable from an efficiency standpoint because an increase in the layer thickness is inversely proportional to a decrease in heat dissipation. Such "lower voltage" devices include, for example, numerous applications of digital technology, bipolar linear technology, automotive technology, linear regulator technology, display technology, and telecommunications technology.

Consequently, a need has developed for an improved "low voltage", high performance, lateral Silicon-On-Insulator (SOI) power device and a method of fabricating such power devices.

DISCLOSURE OF THE INVENTION

It is a principle object of the present invention to provide an improved high performance lateral Silicon-On-Insulator (SOI) power device having a high breakdown potential of the order of $\leq 100$ volts.

Still further, it is an object of the present invention to provide a method of fabricating such an improved device through a novel processing technique which may be used to create a lateral doping gradient.

In carrying out the above stated objects and other objects, features and advantages of the present invention, there is provided a method of fabricating a high performance, lateral Silicon-On-Insulator (SOI) power device having a high breakdown voltage of $\leq 100$ volts. The method includes the initial provision of a thin layer of silicon (preferably on the order of 0.3 microns thick) which has been formed over a thin oxide layer (preferably on the order of 0.4 microns thick) on a silicon substrate. The silicon layer is designated as having a cathode (source) side and an anode (drain) side. A photoresist mask having a single opening is formed over the thin layer of silicon with the mask opening on the anode side of the silicon layer. Thereafter, an impurity is introduced into the silicon layer through the mask opening so as to implant a dopant in the anode side of the silicon layer. The photoresist mask is then removed and the silicon layer is capped to prevent oxidation. By applying heat (a high temperature annealing step) to the silicon layer, the dopant will laterally diffuse toward the cathode side of the silicon layer so as to create a tailored open dopant profile.

In further keeping with the invention, there is further provided a high performance, lateral Silicon-On-Insulator (SOI) power device having a high breakdown voltage of ≦100 volts which may be fabricated in accordance with the above steps. The SOI power device includes a thin layer of silicon (preferably on the order of 0.3 microns thick) which has been formed over a thin oxide layer (preferably on the order of 0.4 microns thick) on a silicon substrate. The silicon layer, which is designated as having a cathode (source) side and an anode (drain) side, further includes a tailored open dopant profile. More specifically, the dopant profile is formed by implanting a dopant through a single mask opening on the anode side of the silicon layer and diffusing the dopant laterally toward the cathode side of the silicon layer.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 1:
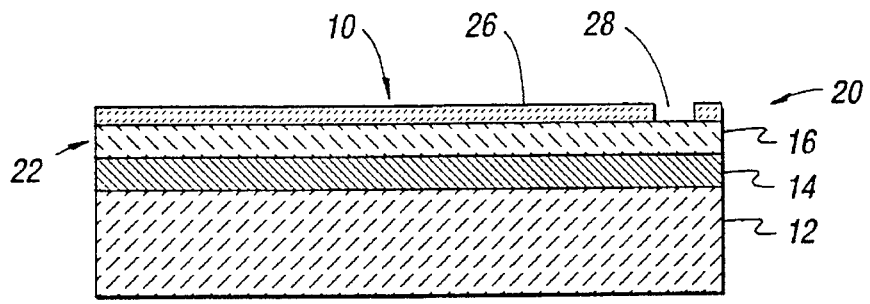
FIG. 1 is a schematic diagram of a thin film Silicon-On-Insulator (SOI) power device shown with a single mask opening in the anode (drain) region in accordance with the present invention.
Figure 2:
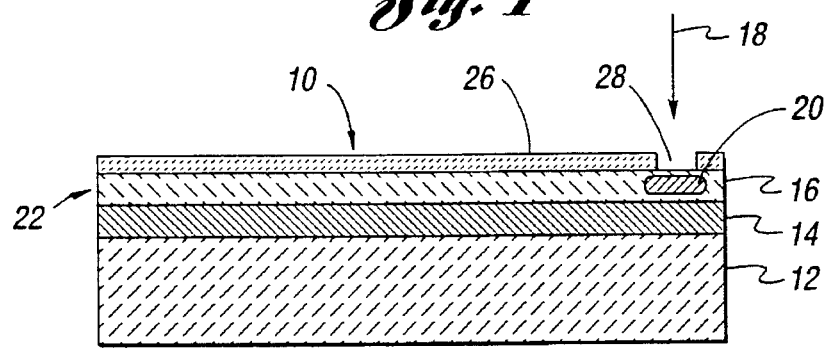
FIGS. 2—4 are schematic diagrams of a thin film SOI power device formed in accordance with the teachings of the present invention having a tailored open dopant profile formed between the anode (drain) and cathode (source) sides of the device.

With reference to FIG. 1, there is shown a schematic diagram of the starting material for a "low voltage" high performance, lateral Silicon-On-Insulator (SOI) power device having a high breakdown voltage. The starting material is designated generally by reference numeral 10 and includes a silicon substrate or wafer 12 having a thin oxide layer 14 on the order of 0.4 microns formed thereon. Preferably, the thin oxide layer is silicon dioxide but may be any other oxide used in the fabrication of semi-conductor devices. Silicon substrate 12 may either be of the N-conductive type or the P-conductive type. A thin silicon layer 16 on the order of 0.3 microns is formed atop the oxide layer 14.

As those skilled in the art will recognize, several methods are known for producing the above-referenced SOI starting material, i.e. substrate 12, oxide layer 14, and silicon layer 16. In one of these methods "SIMOX", silicon oxide is formed by ion implantation of oxygen ions into a silicon wafer. In another known method, Zone-Melt Recrystallized (ZMR) material is prepared by depositing a polycrystalline silicon layer over an oxide-coated silicon wafer and converting the polycrystalline silicon into a monocrystalline silicon film by irradiating the polycrystalline silicon with a power source such as a laser or a graphite strip heater. Yet another known method is the bonding and etch back or direct bonding method in which two oxide-coated silicon wafers are joined together to form a strong bond and one of these wafers is thinned to the desired thickness.

As presently understood by applicant, both the SIMOX and direct bonding techniques are suitable for producing the SOI starting material, i.e. substrate 12, oxide layer 14, and silicon layer 16 of the present invention. By way of background, it is thus understood that, in the direct bonding approach, the oxide-coated silicon wafer which ultimately forms silicon layer 16 will have an original thickness on the order of 0.4 microns prior to the processing, i.e. thinning steps which will result in the ultimate ≈0.3 micron thickness.

Against this background, the novel fabrication technique of the present invention is described in further detail. With reference still to FIG. 1, a mask 26 is formed over the thin layer of silicon 16. Mask 26 may be formed by a photoresist layer patterned photolithographically by a standard technique. Mask 26 includes a single opening 28 on the anode (drain) side 20 of silicon layer 16. This opening 28 is of the order of 1 micron.

Mask 26 is formed to facilitate the doping of the silicon layer. More particularly and as shown in FIG. 1, a dopant 18 is implanted through the opening 28 in the mask 26 into silicon layer 16 in the anode (drain) area of the device to form a doped region 20.

Figure 3:
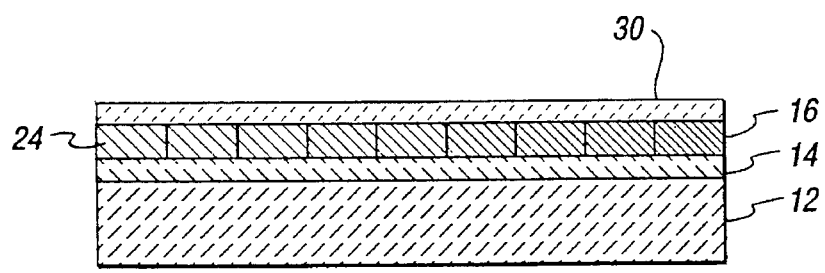
Figure 4:
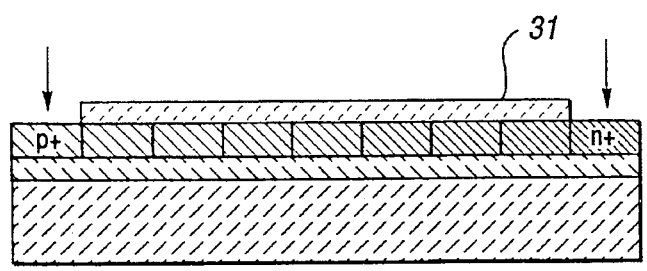

After the ion implantation is carried out, the photoresist layer 26 may be removed and the entire surface of the silicon layer 16 is capped with a silicon nitride layer 30 as shown in FIG. 3. The entire structure thereafter is annealed so as to laterally diffuse the dopant 18 toward the cathode (source) region 22 and create a lateral dopant gradient 24. In FIG. 3, the spacing of the cross-section lines are indicative of the dopant gradient.

The annealing may be carried for various time periods and must be sufficient to ensure a monotonic increase in doping concentration between the anode and cathode sides. It has been found that about 20 hours is sufficient to ensure such a monotonic increase in doping concentration between the anode and cathode sides of the silicon layer 16. This combination of mask, ion implants, and annealing produces an approximate linear variation of doping 24 in the silicon layer 16 over a desired lateral distance.

The silicon nitride left from the previous step of capping and annealing is thereafter removed by reactive etching as known to those skilled in the art from the anode and cathode regions. Thereafter, a photoresist mask 31 is formed over the linearly doped region of the silicon layer 16. After the silicon nitride layer is removed, the wafer may be thermally oxidized followed by chemical etching away of any remaining silicon nitride.

As described above, applicants have therefore found that for SOI structures having $T_{soi}$=0.3 microns and a 100 v blocking voltage, the buried oxide layer may be as thin as 0.4 microns and $L_{bv}$ as small as 5 microns. With these parameters, a new class of high performance "low voltage" power devices may be achieved. Although they depart in theory from the ideal linear gradient, such devices may still deliver an on-resistance as low as 1.2 milliohm-cm$^2$, compared to 1.8 milliohm-cm$^2$ reported in an 80 v-Resurf structure as disclosed, for example, in the publication of R. S. Wrathall, B. J. Baliga, K. Shenai, W. Hennesy, T. P. Chow, "Charge Controlled 80 Volt Lateral DMOSFET With Very Low Specific On-Resistance Designed For An Integrated Power Process", IEDM TECH. DIG., 1990, pp. 954–957.

Figure 5:
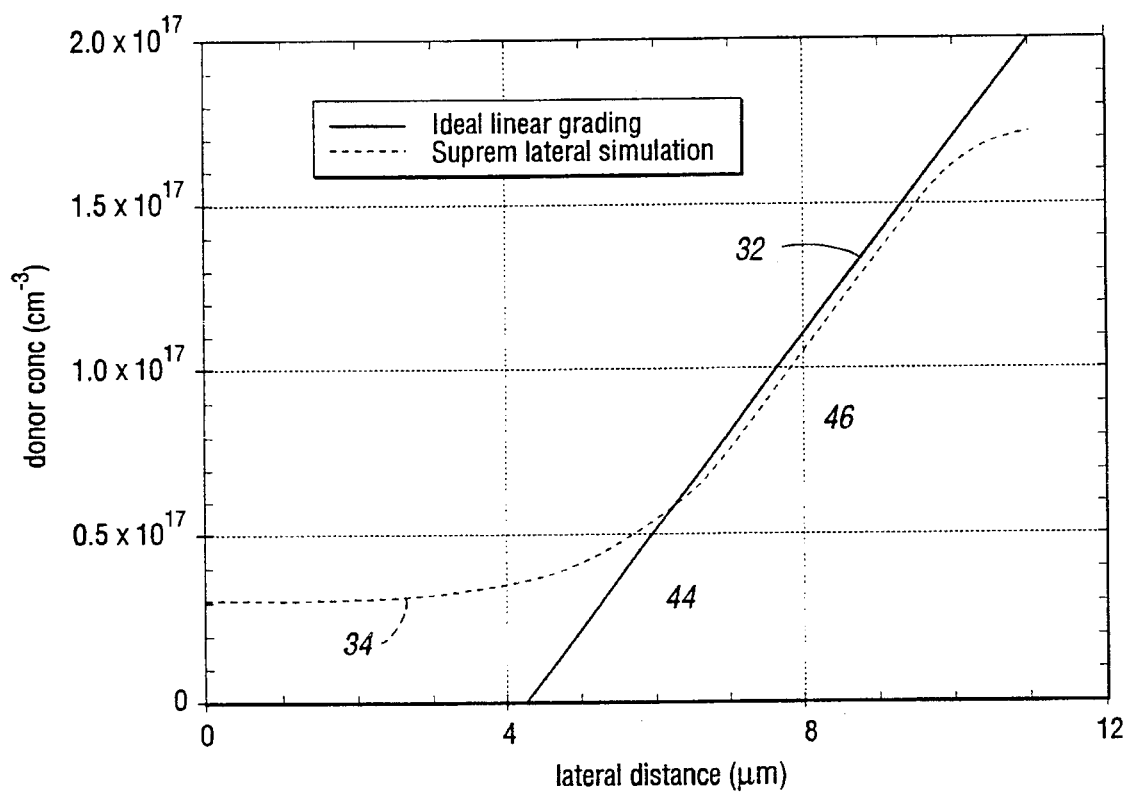
FIG. 5 is a comparative graph of the breakdown voltage achieved by the SOI device of the present invention with reference to ideal linear grading.

While the lateral doping profile illustrated will depart from the optimal linear grading derived in the Merchant et al. publication "Realization Of High Breakdown Voltage (>700 v) In Thin SOI Devices", referenced above, Applicants have found through computer simulation that with a suitably chosen diffusion scheme, the breakdown voltage may still be maintained close to the optimal breakdown voltage with a short linear graded profile, i.e. a lateral distance on the order of 5 microns. This is shown more clearly with reference to FIG. 5 of the drawings wherein the ideal linear grading is shown by reference numeral 32 and the grading achieved by the present invention (through computer simulation) is shown by reference numeral 34.

Figure 6:
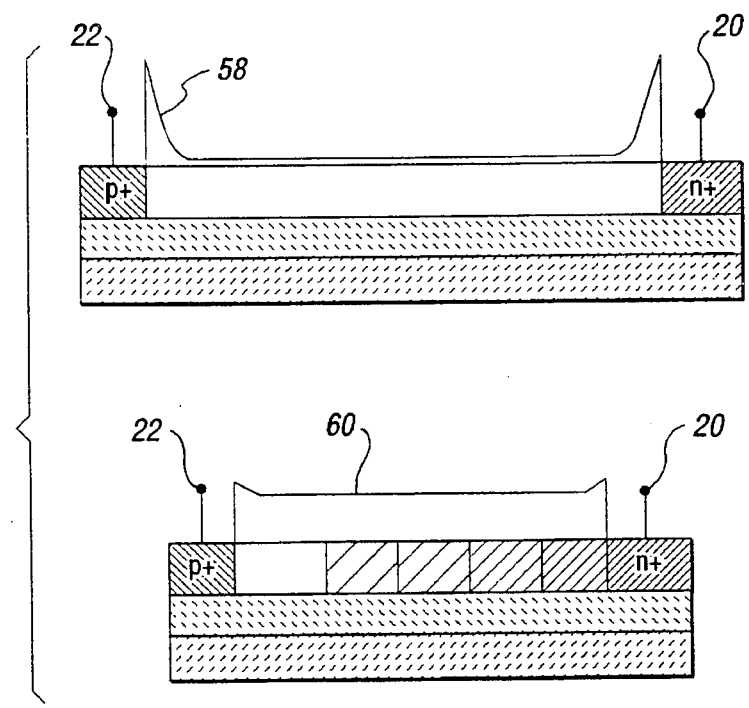
FIG. 6 is a schematic diagram of a conventional diode and a laterally graded diode formed in accordance with the teachings of the present invention illustrating the size and lateral field distribution therebetween.

The resultant devices which may be obtained through the novel lateral diffusion technique described herein offer high area efficiency, low on-resistance and high current density. A comparison of the size and lateral field distribution 58 between a conventional diode and a laterally graded field distribution 60 of a diode fabricated in accordance with the teachings of the present invention is shown, for example, in FIG. 6 of the drawings.

Figure 7:
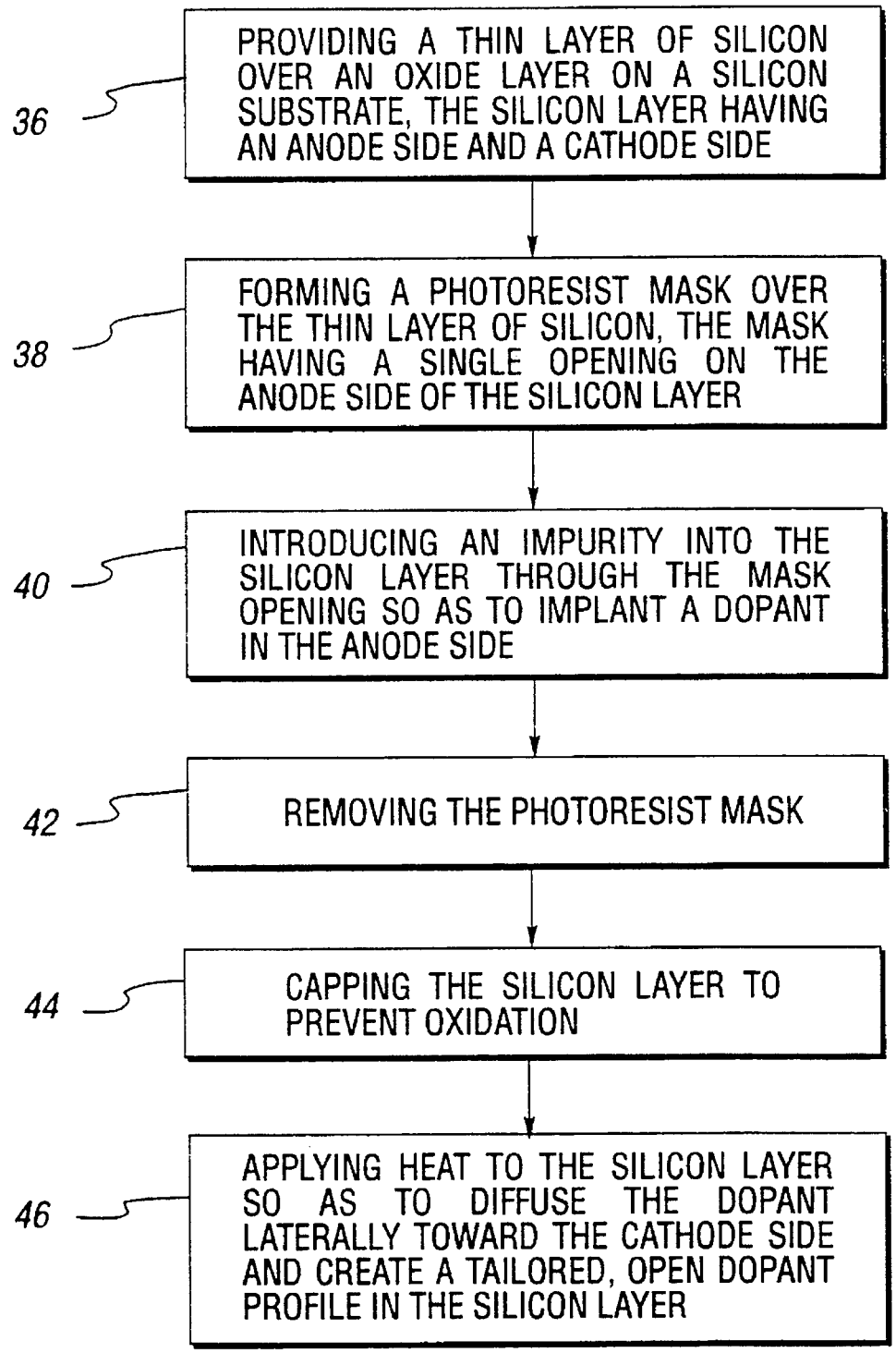
FIG. 7 is a flow diagram of the method steps of the present invention.

Turning now to FIG. 7 of the drawings, the method of fabricating a "low voltage", high performance, lateral Silicon-On-Insulator (SOI) power device having a high breakdown voltage is described in further detail. The method begins with providing 36 a thin layer of silicon 16 on an oxide layer 14 on a silicon substrate 12. The silicon layer 16 includes an anode (drain) side and a cathode (source) side. The method proceeds with the forming 38, of a photoresist mask 26 having a single opening 28 over the thin layer of silicon 16, then introducing 40 a dopant into the anode side of the silicon layer so as to implant a dopant therein. The mask is then removed 42 and the silicon layer 16 is capped 44 with a silicon nitride layer to prevent oxidation. Finally, the capped silicon layer is annealed 46, i.e., applying heat to cause the dopant to be laterally diffused toward the cathode (source) side so as to create a tailored dopant profile in the silicon layer.

While the best mode for carrying out the invention has been described in detail, those familiar with the art to which this invention relates will recognize various alternative designs and embodiments for practicing the invention as defined by the following claims.

What is claimed is:

1. A method of fabricating a high performance, lateral Silicon-On-Insulator (SOI) power device having a breakdown voltage less than approximately 100 v, the method comprising:

providing an oxide layer on a silicon substrate;

providing a silicon layer on said oxide layer, said silicon layer having an anode side and a cathode side;

forming a mask on said silicon layer, said mask having a single opening on said anode side of said silicon layer;

introducing an impurity into said silicon layer through said single opening so as to implant a dopant in said anode side; and applying heat to said silicon layer so as to diffuse said dopant laterally toward said cathode side and create a tailored dopant gradient profile in said silicon layer.

2. The method as in claim 1 wherein said silicon layer is approximately 0.3 microns thick and said oxide layer is approximately 0.4 microns thick.

3. The method as in claim 1 wherein the tailored dopant profile is created in said silicon layer for a lateral distance of approximately 5 microns.

4. The method as claimed in claim 1 comprising, prior to applying heat to said silicon layer, the steps of:

removing said mask; and, applying a capping layer to said silicon layer to prevent oxidation when applying heat.

5. The method as claimed in claim 4 comprising, after applying heat to said silicon layer, the steps of:

removing said capping layer; and, applying a photoresist on said silicon layer.

6. A method of fabricating a lateral Silicon-On-insulator power device comprising the steps of:

a) providing an oxide layer on a silicon substrate;

b) providing a silicon layer, having an anode side and a cathode side, on said oxide layer;

c) forming a mask on said silicon layer having a single opening on said anode side;

d) introducing an impurity into said silicon layer through said single opening so as to implant a dopant in said anode side;

e) removing said mask;

f) applying a capping layer on said silicon layer to prevent oxidation; and, g) applying heat to said silicon layer to cause said dopant to laterally diffuse toward said cathode side to produce an approximate linear variation of dopant in said silicon layer between said anode side and said cathode side.

7. The method as claimed in claim 6 comprising the additional steps of:

h) removing said capping layer; and, i) applying a photoresist mask over the linearly doped region of said silicon layer.

8. The method as claimed in claim 7 wherein:

said silicon layer is formed to be approximately 0.3 microns thick;

said oxide layer is formed to be approximately 0.4 microns thick; and, said silicon layer is formed so the lateral distance between said anode side and said cathode side is approximately 5 microns.

9. The method as claimed in claim 7 where in said capping layer comprises silicon nitride.

* * * * *